United States Patent [19]

Yoshida

[11] Patent Number: 5,460,984

[45] Date of Patent: Oct. 24, 1995

[54] METHOD OF MANUFACTURING A SEMI CONDUCTOR DEVICE HAVING A SECOND WELL FORMED WITHIN A FIRST WELL

[75] Inventor: Tohru Yoshida, Warabi, Japan

[73] Assignee: Kabushiki Kaisha Toshiba, Kawasaki, Japan

[21] Appl. No.: 580,319

[22] Filed: Sep. 10, 1990

[30] Foreign Application Priority Data

Sep. 11, 1989 [JP] Japan .................................. 1-232904

[51] Int. Cl.$^6$ ................................................ H01L 21/265
[52] U.S. Cl. ............................... 437/28; 437/27; 437/29; 437/34; 437/142; 437/149; 437/152; 437/924; 437/984; 148/DIG. 10; 257/274; 257/338; 257/351; 257/371
[58] Field of Search ................................. 437/34, 27, 28, 437/29, 152, 149, 141, 984, 924; 148/DIG. 10; 257/274, 338, 351, 371

[56] References Cited

U.S. PATENT DOCUMENTS

| | | | |
|---|---|---|---|
| 3,212,162 | 10/1965 | Moore | 437/149 |
| 4,567,644 | 2/1986 | Allison | 148/DIG. 10 |
| 4,641,419 | 2/1987 | Kudo | 148/DIG. 10 |
| 4,729,964 | 3/1988 | Natsuaki et al. | 437/29 |
| 4,795,716 | 1/1989 | Yilmaz et al. | 437/29 |
| 4,983,534 | 1/1991 | Kikuta | 148/DIG. 10 |

FOREIGN PATENT DOCUMENTS

| | | |
|---|---|---|
| 60-105267 | 6/1985 | Japan . |
| 60-138955 | 7/1985 | Japan . |
| WO87/05443 | 9/1987 | WIPO . |

OTHER PUBLICATIONS

"Method forming NT–PT Tunnel Junctions", IBM Technical Disclosure Bulletin, Campbell et al., vol. 25, No. 11B, Apr. 1983.

"Silicon Tunnel Diode Process for Bipolar Tech." IBM Technical Disclosure Bulletin Ahlgren et al., vol. 25, No. 11B, Apr. 1983.

"Recorded Oxide Isolation Process", IBM Technical Disclosure Bulletin, vol. 28, No. 8, Jan. 86.

VLSI and Computers, First International Conference on Computer Technology, "Evolution of Dram in Silicon MOS Technology", H. Iizuka, May 1987, pp. 650–655.

Electronics, M. A. Harris, "Scaled–Down C–MOS May Catapult GE to chip forefront", vol. 56, No. 15, Jul. 1983, pp. 47–48.

Electronic Design, F. Goodenough, "Advances in processing grab most of the attention as IEDM's program unfolds", vol. 32, No. 24, Nov. 1984, pp. 73–100.

Primary Examiner—Olik Chaudhuri
Assistant Examiner—Long Pham
Attorney, Agent, or Firm—Foley & Lardner

[57] ABSTRACT

A method of manufacturing a semiconductor device including the steps of: forming an oxide film on the surface of a semiconductor substrate, and thereafter injecting ions of a first conductivity type on the entire surface of the semiconductor substrate; forming a first well through a first thermal diffusion; injecting ions of a second conductivity type through the oxide film into a second well region within the first well; and removing the oxide film formed on the second well region, and thereafter forming a second well having a depth smaller than that of the first well. The semiconductor device manufactured by this method has a first well of a first conductivity type formed on the entire surface of a semiconductor substrate and having higher impurity concentration than that of the semiconductor substrate and a second well of a second conductivity type opposite to said first conductivity type formed within a desired region of said first well. The depth of said first well which is suitable for forming trench capacitors is greater than that of said second well.

3 Claims, 4 Drawing Sheets

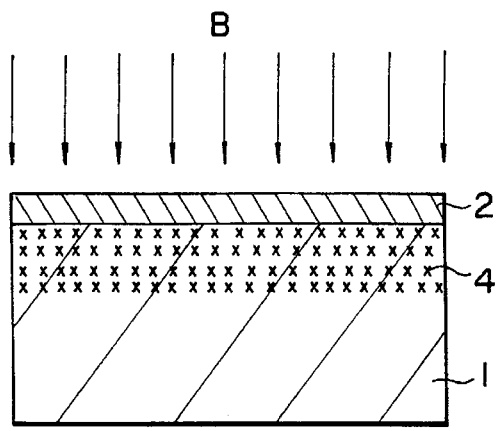
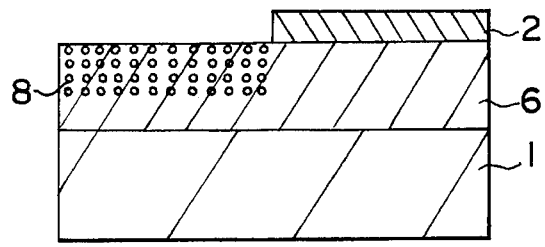
FIG. 1A
FIG. 1D
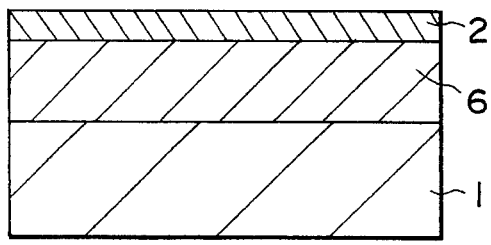
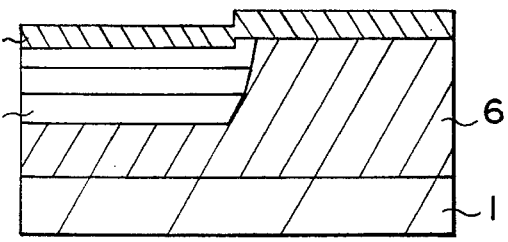
FIG. 1B
FIG. 1E
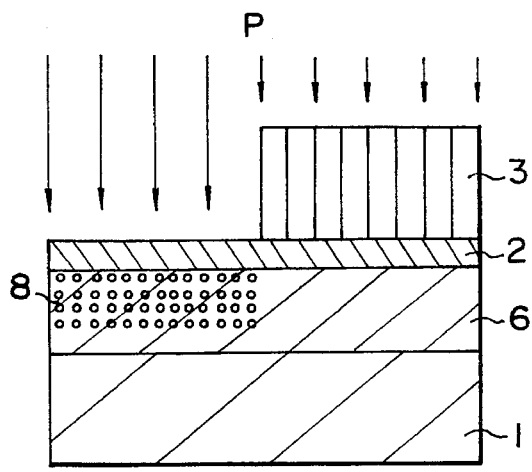
FIG. 1C

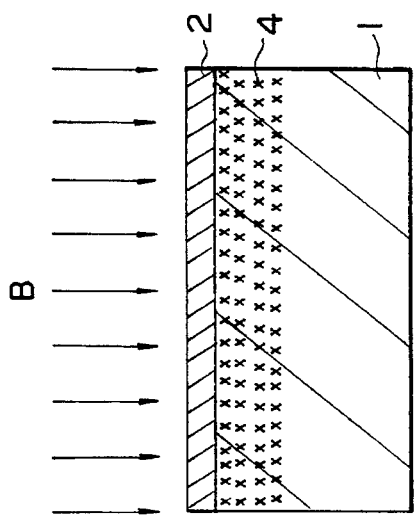
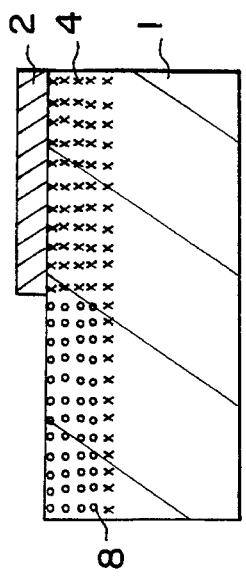
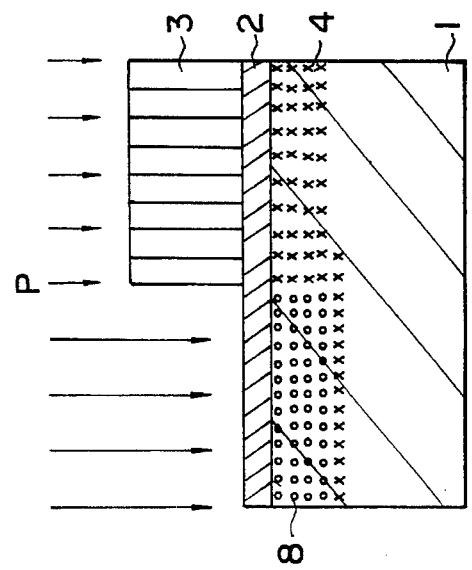
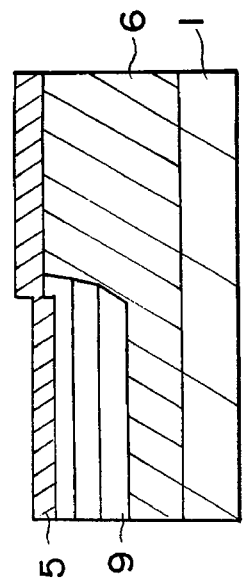

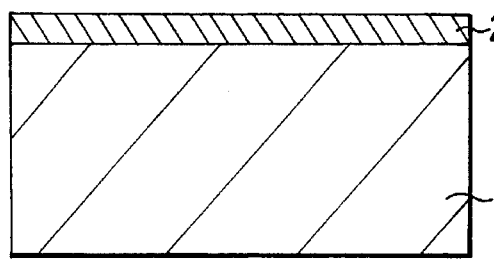
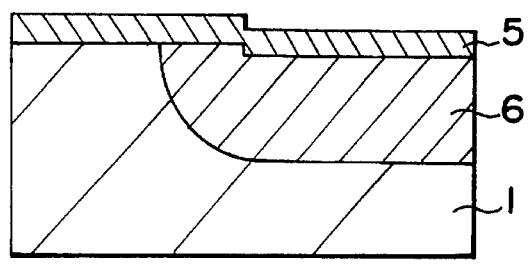
FIG. 4A  FIG. 4D
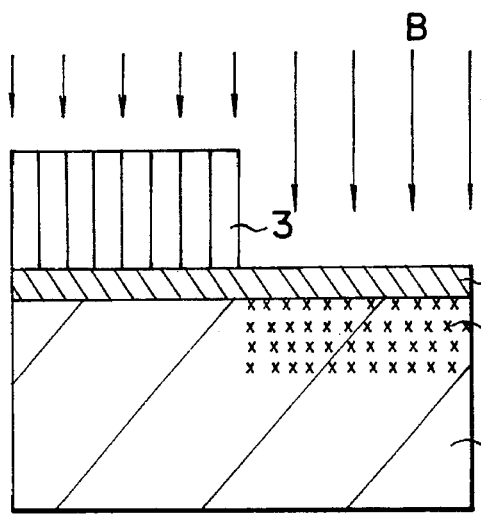
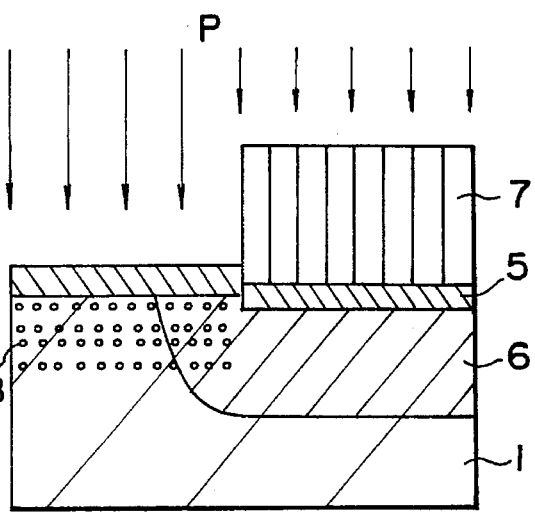
FIG. 4B  FIG. 4E
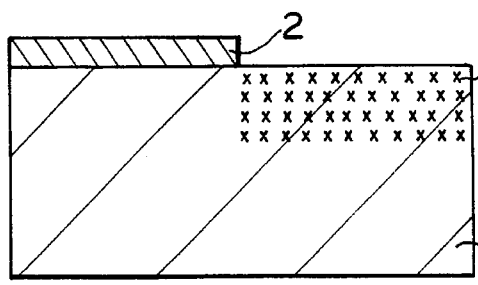
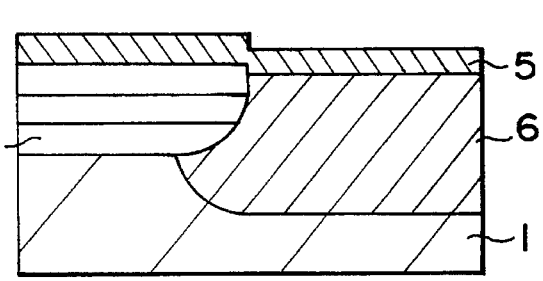
FIG. 4C  FIG. 4F
PRIOR ART

METHOD OF MANUFACTURING A SEMI CONDUCTOR DEVICE HAVING A SECOND WELL FORMED WITHIN A FIRST WELL

BACKGROUND OF THE INVENTION

The present invention relates to a semiconductor device and a method of manufacturing the same, and more particularly, to a complementary MOS integrated circuit with wells and a method of manufacturing the same.

As integrated circuits are miniaturized more and more, memories such as DRAM memories introduce a vertical structure more often than a conventional planar structure. Capacitors of a trench structure are therefore used in such DRAM memories. Various problems are encountered, however, in the manufacture of memories with trench capacitors. One problem is that the well is made deep in order to suppress leakage between trenches of shallow wells.

A conventional method of forming a twin well in a complementary CMOS integrated circuit (hereinafter simply called CMOS IC) will be described with reference to FIGS. 4A to 4F.

A p-type silicon substrate 1 having impurity condition of $1\times10^{15}$ to $5\times10^{15}$ cm$^{-3}$ is subjected to thermal oxidation under an oxygen atmosphere to form a first oxide film 2 having a thickness of 1000 angstroms (FIG. 4A).

A photoresist 3, deposited on the first oxide film 2, is selectively patterned so as to remain on the region where an n-type well is to be formed in order to form a p-type well. By using this photoresist 3 as a mask, boron ions are injected. In this case, a first damage layer 4 is formed by inactive borons (FIG. 4B).

Next, in order to form an alignment mark to be used at the succeeding photoetching process, the oxide film 2 on the p-well region is removed using ammonium fluoride liquid (NH$_4$F) and using the photoresist 3 as a mask. Thereafter, the photoresist 3 is removed (FIG. 4C).

In order to form the alignment mark for the photoetching process, a p-type well 6 is formed through thermal diffusion of boron ions under oxidation atmosphere. In this case, an oxide film 5 is formed at the same time on the p-type well so that a step or a level difference between oxide films is formed on the surface of the silicon substrate 1, of which the step is used as the alignment mark (FIG. 4D).

Next, a photoresist 7 is selectively patterned on the p-type well region. By using the patterned photoresist 7 as a mask, phosphorus ions are injected. In this case, a second damage layer 8 is formed by inactive phosphorus ions (FIG. 4E).

Next, after removing the photoresist 7, thermal diffusion is carried our for the purpose of activation of impurities and obtaining a desired diffusion depth, to thereby form an n-type well 9 and thus a twin well (FIG. 4F). Thereafter, a trench capacitor is formed on the semiconductor substrate by using suitable conventional manufacturing methods.

In the above conventional technique, thermal diffusion under an oxygen atmosphere for the exposed p-type well region on the silicon substrate 1, for example, at step shown in FIG. 4C, may cause Oxidation-induced stacking Faults (OSF). OSFs occur more often in a p-type boron ion injection region than in an n-type phosphorus ion injection region, and increase in proportion with the ion injection dosage. In addition, in forming trench capacitors in DRAM memories, as described previously, it is necessary to form a deep p-type well region in order to suppress leakage between trenches. In order to form a deep p-type well, it is necessary to increase the boron ion injection dose and form at first a p-type well, so that OSFs are likely to occur.

Furthermore, a process of patterning a photoresist is required to be carried out twice in forming a twin well, thereby posing an increased number of manufacturing processes.

SUMMARY OF THE INVENTION

It is therefore an object of this invention to provide a twin well of novel structure.

It is another object of this invention to provide a semiconductor device of high reliability by suppressing the occurrence of crystalline defects in the formation of a twin well.

it is a further object of this invention to provide a method of manufacturing a semiconductor device of high reliability by reducing the number of manufacturing steps.

According to the present invention, there is provided a semiconductor device having a first well of a first conductivity type formed on the entire surface of a semiconductor substrate and having a higher impurity concentration than that of the semiconductor substrate and a second well of a second conductivity type opposite to the first conductivity type formed within a desired region of the first well, wherein the depth of the first well is greater than that of the second well.

According to the present invention, there is also provided a method of manufacturing a semiconductor device comprising the steps of: forming an oxide film on the surface of a semiconductor substrate, and thereafter injecting ions of a first conductivity type on the entire surface of the semiconductor substrate; forming a first well through a first thermal diffusion; injecting ions of a second conductivity type through the oxide film into a region where a second well is to be formed within the first well; and removing the oxide film formed on the second well region, and thereafter forming a second well having a depth smaller than that of the first well.

According to the present invention, there is further provided a method of manufacturing a semiconductor device comprising the steps of: forming an oxide film on the surface of a semiconductor substrate, and thereafter injecting ions of a first conductivity type on the entire surface of the semiconductor substrate; selectively inujecting ions of a second conductivity type into a predetermined region, the injection of the second conductivity type ions being shallower than that of said first conductivity type ions; removing the oxide film formed on the surface of said predetermined region; and forming through thermal diffusion a second well of the second conductivity type ions within a first well of the first conductivity type ions, the depth of the first well being greater than that of the second well.

Semiconductor devices according to the present invention can considerably reduce leakage between trenches of trench capacitors. According to the method of manufacturing a semiconductor device of this invention crystalline defects in the formation of a twin well can be effectively suppressed.

BRIEF DESCRIPTION OF THE DRAWINGS

FIGS. 1A to 1E are cross sections illustrating the manufacturing processes for a semiconductor device according to the present invention;

FIGS. 2A to 2D are cross sections illustrating the manufacturing processes according to a second embodiment of this invention;

FIGS. 4A to 4F are cross sections illustrating the manufacturing processes for a conventional semiconductor device.

DESCRIPTION OF THE PREFERRED EMBODIMENT

Figure 3:
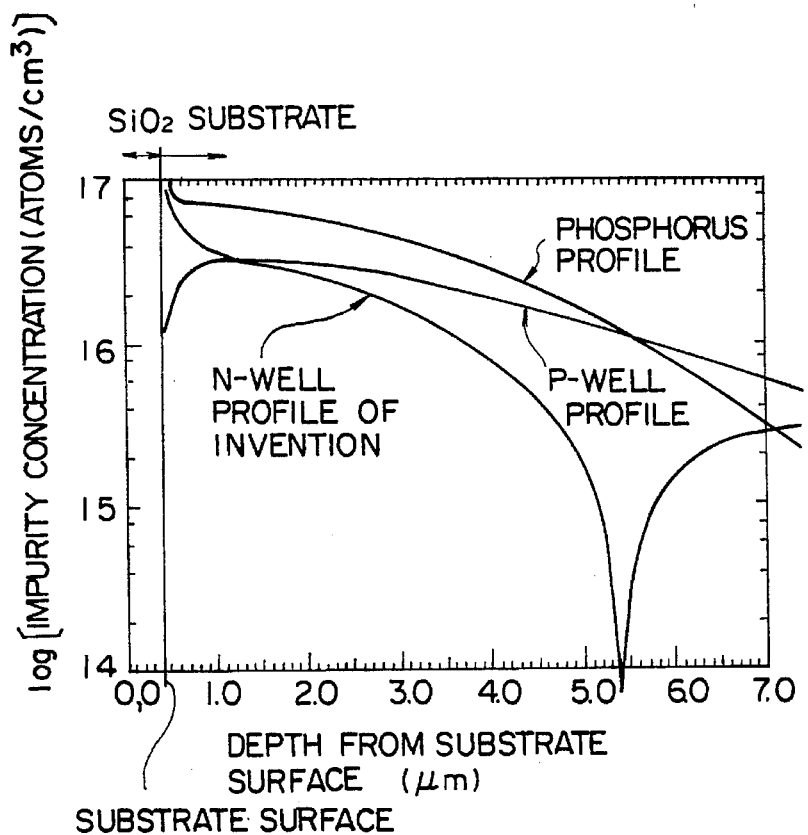
FIG. 3 shows the profile of impurities in an N-type well according to the present invention.

A semiconductor according to an embodiment of this invention is shown in FIG. 1E.

On a p-type silicon substrate (1 to $5\times10^{15}$ cm$^{-3}$ impurity concentration), there are formed a first well 6 (p-type well region, $3\times10^{16}$ cm$^{-3}$) and a second well 9 (n-type well region, $6\times10^{16}$ cm$^{-3}$). The surface of the substrate is formed with an oxide film 5 (SiO$_2$). The depth of the first well is about 10 microns, and that of the second well is about 5 microns. The depth of the first well is two times that of the second well. A trench capacitor formed in such semiconductor device (e.g., DRAM) has a depth of 3 to 5 microns so that leakage between trenches is quite small.

The method of manufacturing such a semiconductor device of this embodiment will be described with reference to FIGS. 1A to 1E.

A p-type silicon substrate 1 is subjected to thermal oxidation under oxygen atmosphere to form an oxide film 2 having a thickness of 1000 angstroms. Thereafter, boron ions are injected over the entire surface of the p-type silicon substrate 1 through the oxide film 2, under the conditions that the injection energy is 150 keV and the dose is $1.5\times10^{13}$ cm$^{-2}$. In this case, a damage layer 4 is formed by boron ion injection (FIG. 1A).

In order to form a first well 6 (p-type well region), thermal diffusion (1190° C., 200 minutes) is carried out under oxygen atmosphere. During this thermal diffusion, the surface of the first damage layer 4 on the silicon substrate 1 is covered with the oxide film 2 so that OSFs will not occur even during the thermal oxidation under oxygen atmosphere (FIG. 1B).

Next, a photoresist 3 is selectively patterned to cover the region other than the region where a well is to be formed. By using this photoresist 3 as a mask, phosphorus ions are injected, under the conditions that the injection energy is 150 key and the injection dose is $2.5\times10^{13}$ cm$^{-2}$. A damage layer 8 is formed by inactive phosphorus (FIG. 1C).

Next, in order to form an alignment mark to be used at the succeeding photoetching process, the oxide film 2 on the n-well region is etched using ammonium fluoride liquid (NH$_4$F) and using the patterned photoresist 3 as a mask. Thereafter, the photoresist is removed (FIG. 1D).

Next, thermal diffusion (1190° C., 480 minutes) is carried out for the purpose of activation of impurities and obtaining a desired diffusion depth, to thereby form a second well 9 (n-type well region) and thus a twin well.

In the above manner, a twin well can be formed while suppressing occurrence of OSFs particularly in the region where p-type ions are injected.

In the above embodiment of this invention, the first thermal diffusion is carried out for forming a deep p-type well in a DRAM having a trench capacitor. For a DRAM without a trench capacitor (using a stacked capacitor or a planar capacitor), the first thermal diffusion is omitted and the second thermal diffusion is used for both p-type and n-type well diffusion. Specially, after injecting boron ions (FIG. 2A), phosphorus ions are selectively injected (FIG. 2B) and thermal diffusion is carried out to thereby realize the structure (FIG. 2D) same as shown in FIG. 1E.

Furthermore, a although a twin well is formed in the embodiment, this invention is applicable to forming a triple or threefold well by forming the third well after forming the second well 9 in the similar manner described above. By repeating the above steps, a multiple well such as quadruple-well, quintuple-well and so on, may also be formed.

Although a p-type silicon substrate is used, the invention is applicable to an n-type silicon substrate.

Furthermore, although the first well is of p-type and the second well is of n-type, this conduction type may be reversed.

Figure 5:
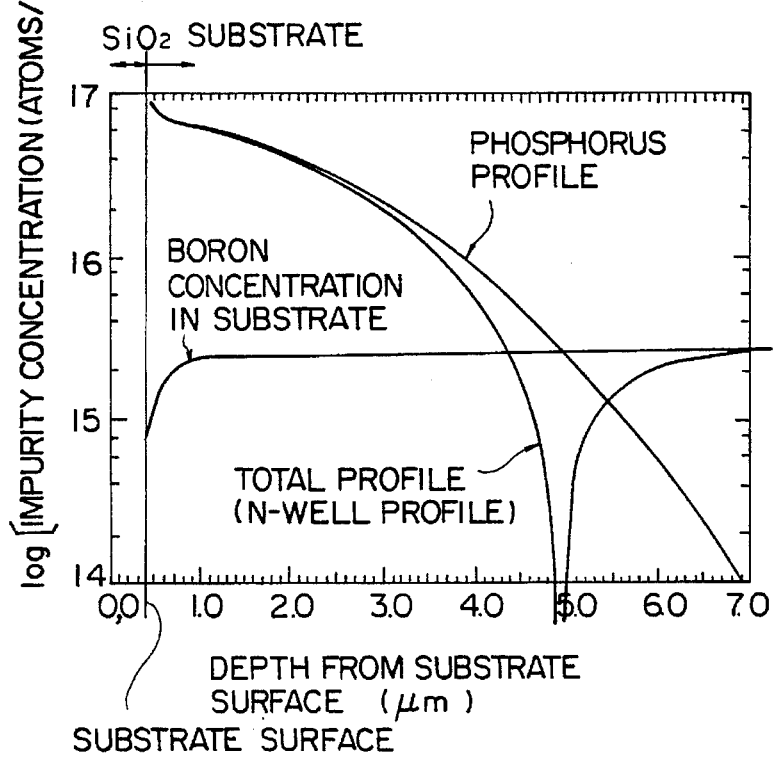
FIG. 5 shows the profile of impurities in a conventional N-type well.

As described in detail, according to the present invention, the profile of impurities in n-type well substantially the same as conventional can be realized by properly setting the first thermal diffusion time, phosphorus ion injection conditions (acceleration energy, dose) for the formation of an n-type well region, and second thermal diffusion time. The profile of impurity concentration in an n-type well according to this invention is shown in FIG. 3, and the profile of impurity concentration in a conventional n-type well is shown in FIG. 5. As understood from FIGS. 3 and 5, both the profiles are substantially the same.

According to the present invention, in forming the p-type well, thermal diffusion is carried out while covering the surface of the silicon substrate 1 with the oxide film 2 so that the occurrence of OSFs can be suppressed in the order of 0.2/cm$^2$ and the pn-junction leakage can also be suppressed, allowing the formation of a semiconductor device of high quality and reliability.

Furthermore, in forming a twin well, the conventional method requires the two processes of patterning a photoresist, whereas the present invention requires one photoresist patterning process thereby reducing the number of processes.

What is claimed is:

1. A method of manufacturing a semiconductor device comprising the steps of:

forming an oxide film on the surface of a bulk semiconductor substrate, and thereafter injecting ions of a p-type over the entire surface of said bulk semiconductor substrate;

performing a first heat treatment for forming a first well through a first thermal diffusion for activating said ions of the p-type;

forming a mask layer on the oxide film, said mask layer having an aperture corresponding to a second well region where a second well is to be formed within said first well;

injecting ions of an n-type through said oxide film into the second well region;

removing said mask layer and said oxide film formed on said second well region; and performing a second heat treatment for diffusing said ions of the n-type to form a second well having a depth smaller than that of said first well and to form an oxide film on said second well which has a step-wise alignment mark at the boundary between said first well and said second well.

2. A method of manufacturing a semiconductor device comprising the steps of:

forming an oxide film on the surface of a bulk semiconductor substrate, and thereafter injecting ions of a p-type over the entire surface of said bulk semiconductor substrate;

forming a mask layer on the oxide film, said mask layer having an aperture corresponding to a predetermined region;

selectively injecting ions of an n-type into said predetermined region, and injection depth of said n-type ions being shallower than that of said p-type ions;

removing said mask layer and said oxide film formed on the surface of said predetermined region; and performing heat treatment for forming a first well of said p-type and a second well of said n-type within said first well by activating said p-type and n-type ions and forming an oxide film on said second well which has a step-wise alignment mark at the boundary between said first well and said second well.

3. A method of manufacturing a semiconductor device as claimed in claim 2, wherein the steps are repeated to form a third well within the second well, the third well being shallower in depth than the second well and having p-type ions.

* * * * *